(12) United States Patent
Matsumoto (10) Patent No.: US 6,342,955 B1
(45) Date of Patent: Jan. 29, 2002

(54) IMAGE READING/RECORDING APPARATUS (75) Inventor: Yasuhiro Matsumoto, Moriya-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/184,035

(22) Filed: Nov. 2, 1998

(30) Foreign Application Priority Data

Nov. 6, 1997 (JP) .............................................. 9-303810

(51) Int. Cl.$^7$ ................................................. H04N 1/04
(52) U.S. Cl. ...................................... 358/471; 358/474
(58) Field of Search ............................... 358/400, 401, 358/474, 471, 498, 496, 473; 382/313

(56) References Cited

U.S. PATENT DOCUMENTS

| | | | |
|---|---|---|---|
| 5,281,977 A | * | 1/1994 | Kurita ........................ 358/296 |
| 5,414,533 A | * | 5/1995 | Sawase et al. ............... 358/473 |
| 5,452,110 A | * | 9/1995 | Hatano et al. ............... 358/494 |
| 5,552,902 A | * | 9/1996 | Kohno ........................ 358/498 |
| 5,822,081 A | * | 10/1998 | Hatano et al. ............... 358/400 |
| 5,884,117 A | * | 3/1999 | Tanoue et al. ............... 358/496 |

* cited by examiner

Primary Examiner—Cheukfan Lee
(74) Attorney, Agent, or Firm—Fitzpatrick, Cella, Harper & Scinto (57) ABSTRACT

In this invention, in an image reading/recording apparatus such as a facsimile apparatus or the like, which has an image reading unit for reading image information by conveying an original along an original convey path, and a recording unit for recording an image by conveying a recording sheet along a recording sheet convey path, a power supply board is placed at the bottom surface position of the apparatus body, a control board is placed on the side surface of the apparatus body, and an NCU board having a communication circuit is placed on the back surface of the apparatus body, thereby simplifying and facilitating connections among the boards.

15 Claims, 5 Drawing Sheets

IMAGE READING/RECORDING APPARATUS

BACKGROUND OF THE INVENTION

1. Field of the Invention

The present invention relates to an image reading/recording apparatus having an image reading unit for reading image information, and an image forming unit for forming an image and recording it on a recording medium.

2. Related Background Art

As a conventional image reading/recording apparatus, a facsimile apparatus, which has an image reading unit and image forming unit, and has a function of communicating image information, is known. Facsimile apparatuses used in offices and the like, and especially, compact, desktop apparatuses, must meet requirements for further size and cost reductions, and higher-speed processing.

Figure 4:
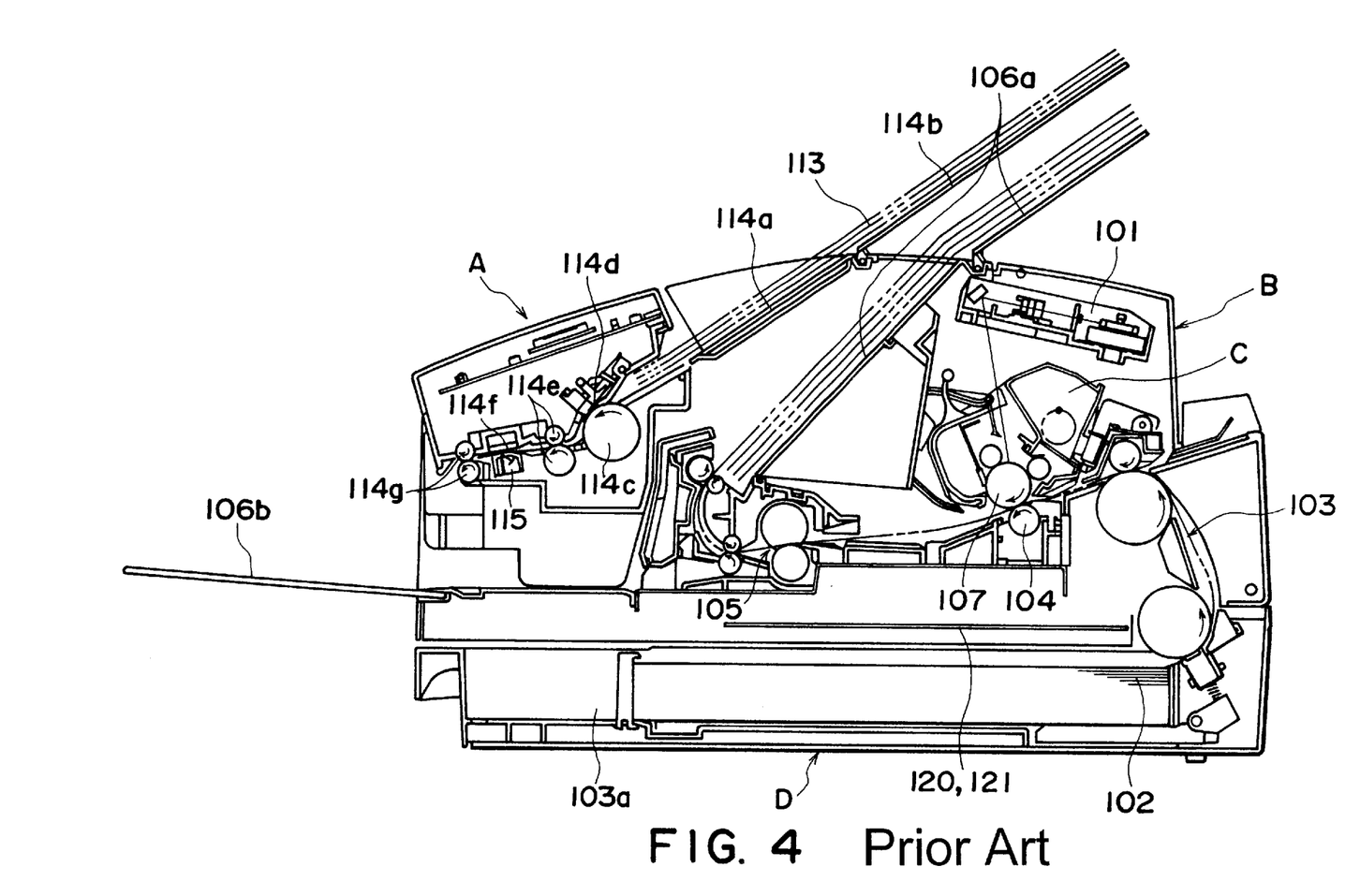
FIG. 4 is a sectional view of a conventional image reading/recording apparatus.
Figure 5:
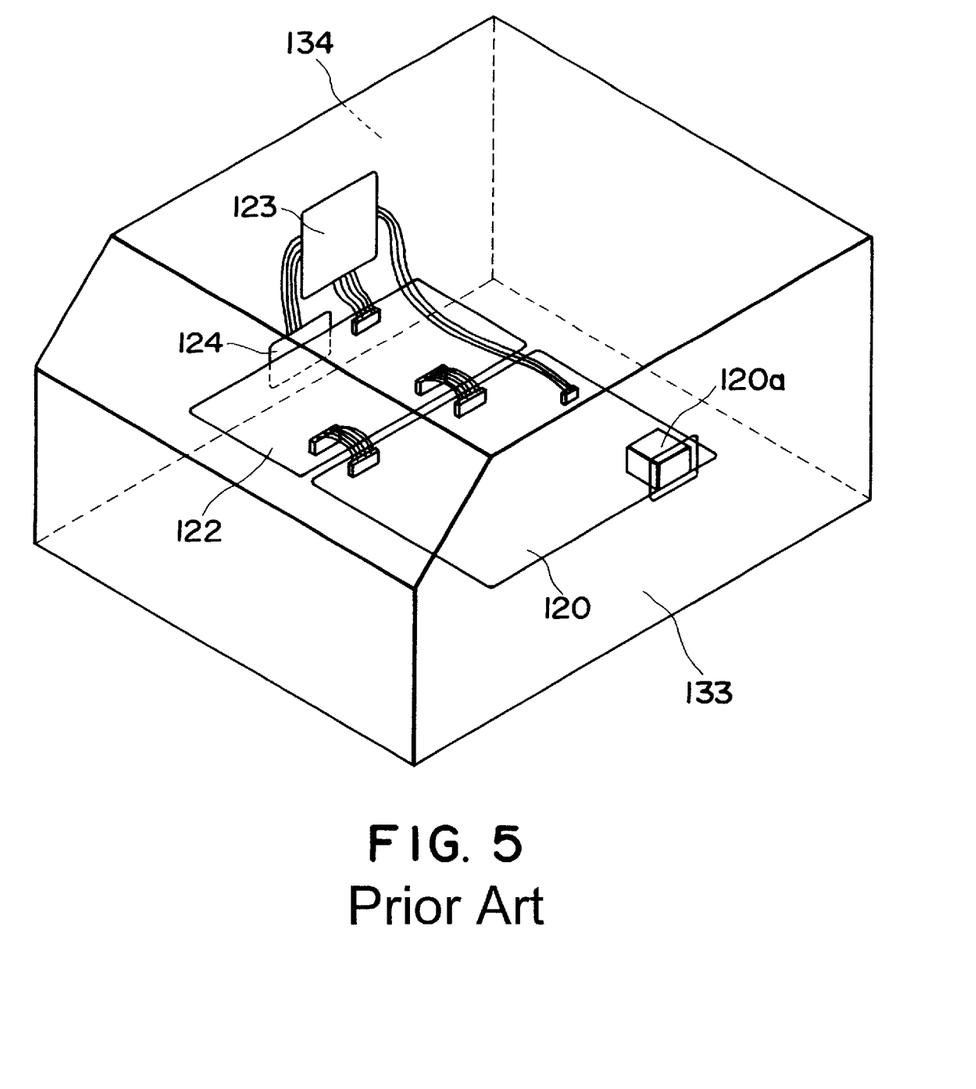
FIG. 5 is a perspective view showing the layout of circuit boards in the image reading/recording apparatus shown in FIG. 4.

The arrangement of a conventional facsimile apparatus and the layout of circuit boards will be described below with reference to the sectional view in FIG. 4 and the perspective view in FIG. 5.

In the arrangement of the facsimile apparatus shown in FIG. 4, an image reading unit A is placed in the upper front portion (upper left portion in FIG. 4) of an apparatus body (to be simply referred to as a body hereinafter), and an image forming unit B is placed behind the unit A. Image information of an original read by the image reading unit A is transmitted to another facsimile apparatus in the facsimile mode, or is transferred to and recorded by its own image forming unit B in the copy mode.

The image reading unit A conveys an original 113, and reads image information described on the original 113. Originals 113 stacked on an original table 114a and auxiliary table 114b are picked up one by one by a pickup roller 114c and pickup piece 114d, which is pressed against the roller 114c, and the picked-up original 113 is conveyed by a pair of convey rollers 114e. A pressing means 114f presses that original 113 against a contact sensor 115 of an image reading means to read image information on the original 113. After that, the original 113 is exhausted onto a tray 106b outside the apparatus by a pair of exhaust rollers 114g.

The image forming unit B irradiates a photosensitive drum 107 as a rotating image carrier with an optical image based on image information received from another facsimile apparatus or that read by its own image reading unit A via an optical system 101, and forms an electrostatic latent image corresponding to the image information by selectively exposing the surface of the photosensitive drum 107. A developing unit prepared as a process cartridge C then forms a toner image on the surface of the photosensitive drum 107.

On the other hand, a convey means 103 picks up and conveys the uppermost one of recording sheets 102 horizontally stacked in a paper cassette 103a, which can be pulled out from one end of a paper feed unit D. The conveyed recording sheet is reversed via a U-turn path, and is then conveyed to a transfer means 104. The transfer means 104 applies a voltage of a polarity opposite to that of a toner image formed on the photosensitive drum 107, thereby transferring the toner image on the photosensitive drum 107 onto the recording sheet 102. After that, the recording sheet 102 is conveyed to a fixing means 105, and the toner image on the recording sheet 102 is fixed thereon upon application of heat and pressure. The fixed recording sheet 102 is exhausted onto a face-down tray 106a in the face-down exhaust mode which exhausts the recording sheet 102 with the recorded surface facing down or onto the face-up tray 106b in the face-up exhaust mode which exhausts the recording sheet 102 with the recorded surface facing up.

The layout of the circuit boards will be explained below. A power supply board 120 having a power supply input unit 120a, high-voltage circuit, and the like, and a control board 122 having a CPU, body control circuit, image processing circuit, and the like are juxtaposed at the right and left positions below the image forming unit B and above the surface of the paper cassette 103a, as shown in FIG. 5. The power supply input unit 120a is exposed outside the body from a hole open to a right side surface 133 of the body and receives electric power via a power supply cord (not shown). An NCU board 123 having a communication circuit is placed above the control board 122 on a left side surface 134 of the body on the left side of the image forming unit B. Furthermore, a modular board 124 having a modular jack connector for connecting the apparatus to a telephone line is placed below the NCU board 123 and control board 122. The modular jack connector (not shown) is exposed outside the body via a hole (not shown) open to the left side surface 134 of the body, and is connected to a line via a communication cable (not shown), thus allowing communications of image data and the like.

The power supply board 120 and control board 122, the power supply board 120 and NCU board 123, the control board 122 and NCU board 123, and the NCU board 123 and modular board 124 are respectively connected to each other via cables, connectors, and the like to supply electric power, exchange signals, and connect ground.

In this fashion, in the arrangement for conveying the recording sheet 102 from the paper cassette 103a to the transfer means 104 while being reversed via the U-turn path, the respective circuit boards are efficiently laid out to avoid the convey path of the recording sheet.

However, in the above prior art, a power supply cable for electrically connecting the power supply board 120 and NCU board 123 crosses the control board 122, resulting in complicated connections of cables. Also, an insulating member is required between the cable and control board 122 due to limitations on safety standards, resulting in high parts cost, poor assembly, and high assembly cost.

The power supply cord is attached from the right side surface 133 of the body, and the communication cable for line connections is attached from the left side surface 134 of the body. Hence, when the user uses the apparatus on the desktop, these cords extend on the desktop and require extra spaces, thus broadening the installation space of the apparatus in practice.

Furthermore, since the recording sheet 102 is stored in the paper cassette 103a and is conveyed from the cassette 103a to the transfer means 104 while being reversed via the U-turn path, the size of the apparatus is determined by that of the recording sheet 102 that the apparatus can process, thus disturbing a size reduction. At the same time, the length of a recording sheet convey path from the leading end position of the recording sheet 102 to the transfer means 104 is prolonged, thus requiring a long convey time and disturbing high-speed image recording.

SUMMARY OF THE INVENTION

It is an object of the present invention to solve the aforementioned problems, and to provide an image reading/recording apparatus which simplifies the connection routes among boards to facilitate connections among the boards.

It is another object of the present invention to prevent a connection means for connecting boards from crossing other boards by placing the respective circuit boards along the neighboring ones of the bottom, side, and back inner surfaces of a body.

Other objects of the present invention will become apparent from the following detailed description of the embodiments to be described below.

DESCRIPTION OF THE PREFERRED EMBODIMENTS

The preferred embodiments of the present invention will be described hereinafter with reference to the accompanying drawings.

The first embodiment of the present invention will be described taking a facsimile apparatus as an example. The following explanations are given in the order of:

(1) the overall arrangement of the facsimile apparatus;

(2) an image reading unit for reading image information;

(3) the arrangement of an image forming unit for forming and recording image information; and (4) the layout of circuit boards.

[Overall Arrangement of Facsimile Apparatus]

Figure 1:
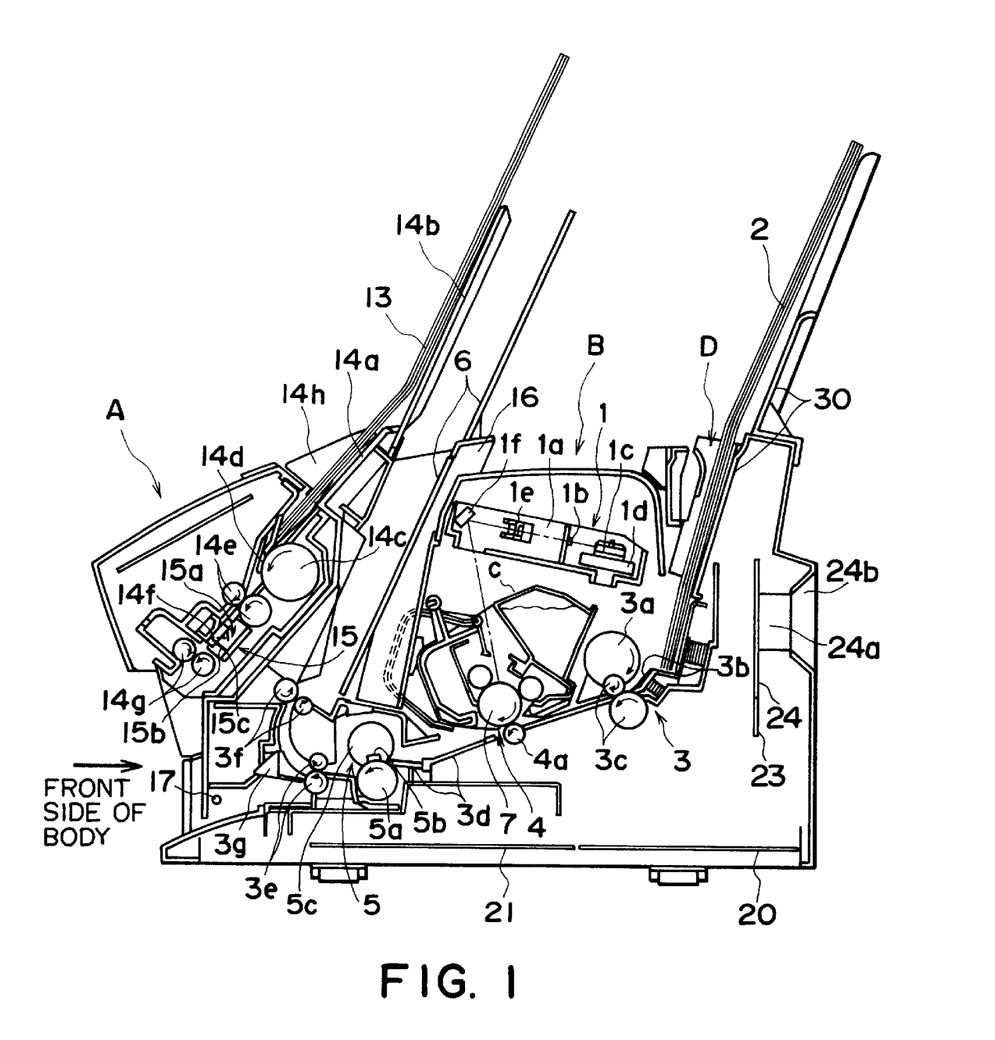
FIG. 1 is a sectional view of an image reading/recording apparatus according to the first embodiment of the present invention.
Figure 2:
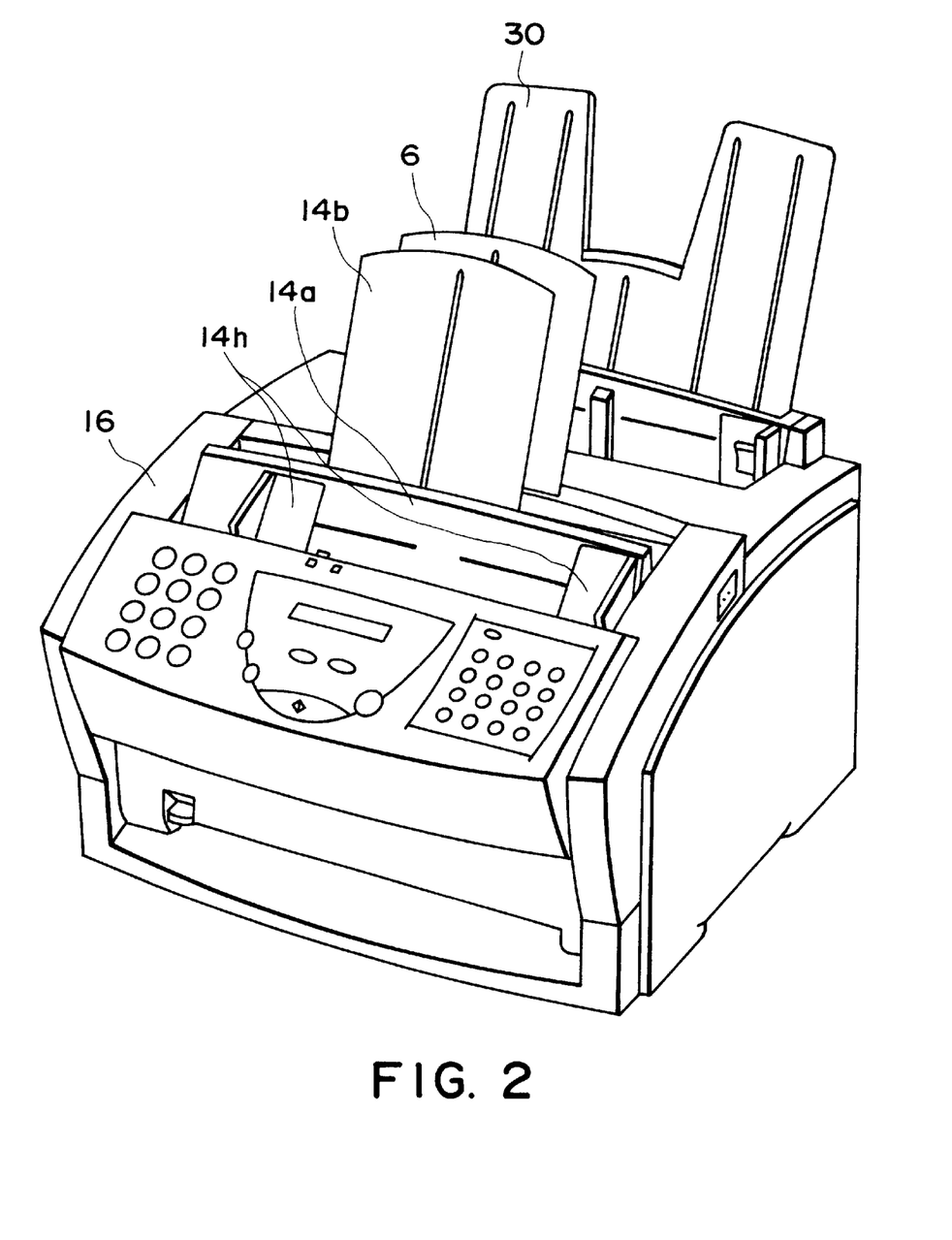
FIG. 2 is a perspective view showing the outer appearance of the image reading/recording apparatus shown in FIG. 1.

FIG. 1 is a sectional view showing the overall arrangement of the facsimile apparatus, and FIG. 2 is a perspective view showing the outer appearance of the entire apparatus shown in FIG. 1.

As shown in FIG. 1, this facsimile apparatus has an image reading unit A in the upper front portion of the body, and an image forming unit B behind the unit A. Image information read from an original 13 by the image reading unit A is transmitted to another facsimile apparatus in the facsimile mode, or is transferred to and recorded by its own image forming unit B in the copy mode.

The image forming unit B irradiates a photosensitive drum 7 as an image carrier with an optical image based on image information via an optical system 1, and forms an electrostatic latent image on the photosensitive drum 7. In synchronism with formation of the electrostatic latent image, a recording sheet 2 is conveyed by a convey means 3, and a toner image forming unit which integrates the photosensitive drum 7, a developer for applying toner to the drum 7, and the like as a process cartridge C forms a toner image corresponding to the electrostatic latent image on the photosensitive drum 7. The toner image is transferred onto the recording sheet 2 by a transfer means 4. The recording sheet 2 is conveyed to a fixing means 5 to fix the toner image, and is then exhausted onto an exhaust tray 6 or outside the apparatus.

[Arrangement of Image Reading Unit]

The image reading unit A conveys an original 13 and reads image information on the original 13. The unit A has an arrangement shown in FIG. 1. That is, originals 13 stacked on an original table 14a and auxiliary table 14b in a direction having a small tilt from the vertical direction are picked up one by one by a pickup roller 14c and pickup piece 14d, which is pressed against the roller 14c, and the picked-up original 113 is conveyed by a pair of convey rollers 14e. A pressing means 14f presses that original 13 against a reading means 15 constructed as a contact sensor to read image information on the original 13. After that, the original 13 is exhausted outside the apparatus by a pair of exhaust rollers 14g.

In the reading means 15, the image information surface of the original 13 is irradiated with light emitted by an LED 15a as a light source, and the light reflected by the surface is imaged on a photoelectric conversion element 15c via a short-focal point imaging lens 15b, thus reading image information. The signal output from the reading means 15 is transmitted to another apparatus in the facsimile mode, or to its own image forming unit B in the copy mode.

Note that the original table 14a has a slider 14h which is slidable in a direction perpendicular to the convey direction of the original 13 (i.e., the widthwise direction of the original 13). By sliding this slider in correspondence with the width of the original 13, the two sides of originals 13 placed on the original table 14a can be adjusted.

[Arrangement of Image Forming Unit]

The arrangements of the respective members of the image forming unit B that forms an image in accordance with an image signal and records it on a recording sheet will be described in the order of (1) the optical system, (2) a recording sheet convey means, (3) the transfer means, (4) the fixing means, (5) a process cartridge mounting means, and (6) the layout of the respective members.

(1) Optical System

An optical system 1 irradiates the photosensitive drum 7 with light, i.e., an optical image on the basis of image information received from another facsimile apparatus or image information read by the image reading unit A, and has an arrangement shown in FIG. 1. More specifically, in the optical system 1, an optical unit 1a houses a laser diode 1b, polygonal mirror 1c, scanner motor 1d, imaging lens 1e, and reflection mirror 1f.

When an image signal received from, e.g., another facsimile apparatus is supplied to the optical system 1, the laser diode 1b emits light in accordance with the image signal, and irradiates the polygonal mirror 1c with the emitted light as image light. The polygonal mirror 1c is rotated at high speed by the scanner motor 1d, and the image light reflected by the polygonal mirror 1c becomes incident on the rotating photosensitive drum 7 via the imaging lens 1e and reflection mirror 1f, thus forming an electrostatic latent image corresponding to image information by selectively exposing the surface of the drum 7.

(2) Recording Sheet Convey Means

The convey means 3 for conveying a recording sheet 2 is placed beneath the rear side of the image forming unit B. A paper feed tray 30 of a paper feed unit D for supplying a recording sheet 2 as a recording medium to the image forming unit B extends in a direction having a small tilt from the vertical direction. The uppermost one of a stack of recording sheets 2 supported on the paper feed tray 30 in a direction having a small tilt from the vertical direction is picked up by a pickup roller 3a which is set at a position below the paper feed unit and in front of the lower end of the recording sheet 2, and a pickup pad 3b which is pressed against the roller 3a, and is fed to a pair of convey rollers 3c. The pair of convey rollers 3c convey the recording sheet 2 to the transfer means 4 in synchronism with image formation. After image transfer, the recording sheet 2 is conveyed to the fixing means 5 by a guide member 3d, and the fixed recording sheet 2 is exhausted onto the exhaust tray 6 by pairs of exhaust rollers 3e and 3f in the face-down exhaust mode, or outside the apparatus by the pair of exhaust rollers 3e by switching a selector guide 3g in the face-up exhaust mode. Note that the exhaust tray 6 supports the recording sheets 2 in a direction having a small tilt from the vertical direction in the same manner as the paper feed tray 30 of the paper feed unit D.

(3) Transfer Means

The transfer means 4 transfers a toner image formed on the photosensitive drum 7 by the image forming unit onto a recording sheet 2, and is constructed by a transfer roller 4a in this embodiment, as shown in FIG. 1. More specifically, the transfer roller 4a presses the recording sheet 2 against the photosensitive drum 7 of the process cartridge C mounted on the apparatus, and a voltage of a polarity opposite to that of the toner image formed on the photosensitive drum is applied to the transfer roller 4a, thereby transferring the toner image on the photosensitive drum 7 onto the recording sheet 2.

(4) Fixing Means

The fixing means 5 fixes, on the recording sheet 2, the toner image, which is transferred onto the recording sheet 2 by applying a voltage to the transfer roller 4a. The fixing means 5 has an arrangement as shown in FIG. 1. That is, the fixing means 5 is composed of a driving roller 5a which is driven to rotate, and a fixing member 5c which includes a heater 5b and has a sheet member which is rotated in contact with the driving roller 5a. When the recording sheet 2 on which the toner image has been transferred by the fixing means 4 passes between the driving roller 5a and fixing member 5c, a pressure is applied to the recording sheet 2 by the driving roller 5a and fixing member 5c, which are in tight contact with each other, and heat generated by the heater 5b is applied to the recording sheet 2, thus fixing the toner image on the recording sheet 2 thereon.

(5) Process Cartridge Mounting Means

The image forming unit B has the cartridge mounting means for detachably mounting the process cartridge C which integrates the photosensitive drum 7, the developer for forming a toner image by applying toner to the drum 7, and the like. The process cartridge C is attached to/detached from the apparatus body from the front side of the body by opening a cover 16 in the front surface direction. That is, as shown in FIG. 1, a rotation center 17 is formed at the lower front portion of the body, and the cover 16 is rotated about the rotation center 16 with respect to the apparatus body to be open in the front surface direction. When the cover 16 is opened, a cartridge mounting space assured in the apparatus body is exposed. On the right and left wall surfaces of this space, guide grooves (not shown) are formed. The process cartridge C is mounted on the image forming unit B by inserting the process cartridge C while adjusting the shaft of the drum 7 to these guide grooves, and closing the cover 16.

(6) Layout of Respective Members

As shown in FIG. 1, the convey path of the recording sheet 2 in the image forming unit B communicates from the lower portion of the paper feed unit D which nearly vertically supports the recording sheets 2 by the paper feed tray 30 with the lower portion of the exhaust tray 6 which nearly vertically supports the recording sheets 2 exhausted from the image forming unit B, and the respective members of the image forming unit B are located above and below this recording sheet convey path.

More specifically, the optical system 1 and process cartridge C are placed above the convey path, and the recording sheet convey means 3 and transfer means 4 are placed above and below the convey path. Also, the fixing means 5 is placed below the convey path.

[Layout of Circuit Boards]

The layout of circuit boards in the facsimile apparatus of this embodiment will be explained below with reference to FIG. 3.

Figure 3:
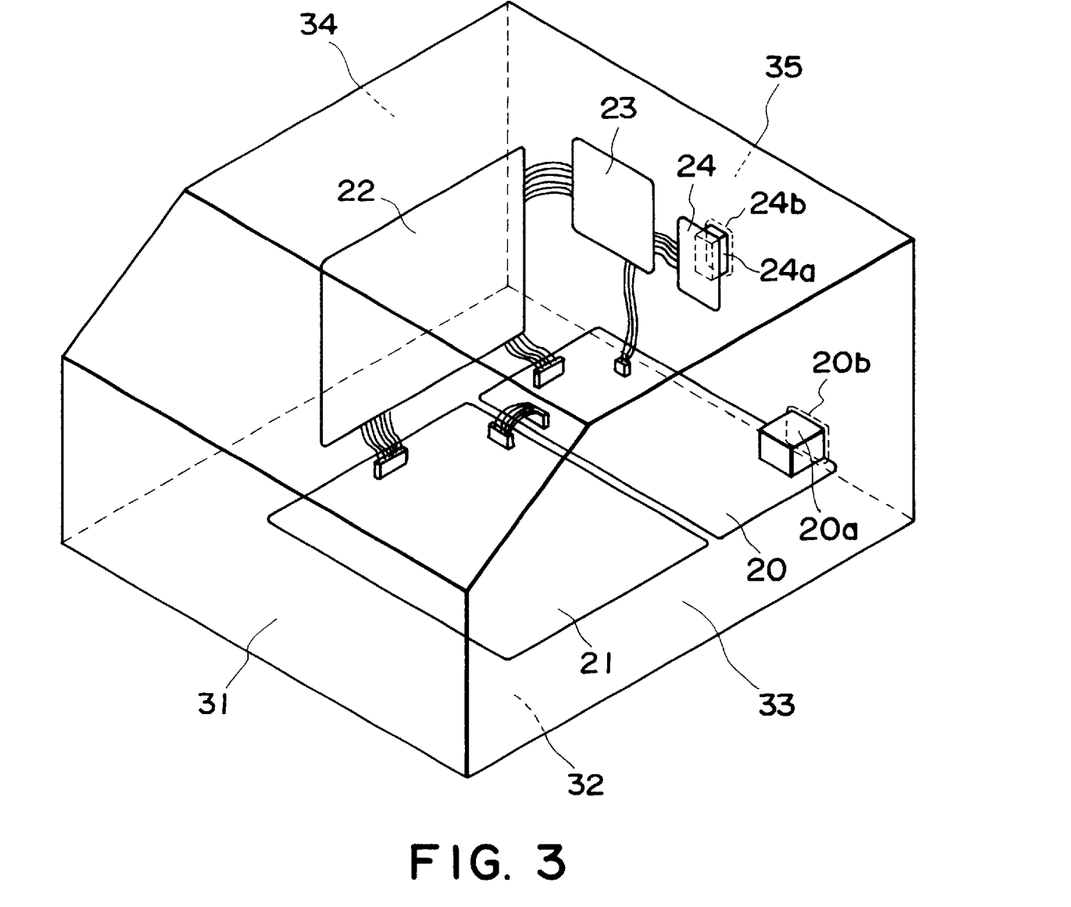
FIG. 3 is a perspective view showing the layout of circuit boards in the image reading/recording apparatus shown in FIG. 1.

Referring to FIG. 3, a power supply board 20 having a power supply circuit including a power supply input unit 20a is placed below the image forming unit B along the an inner bottom surface 32 of the body at a position near a back surface 35 of the body. Also, a high-voltage board 21 having a high-voltage circuit for supplying a high voltage to the image forming unit B is juxtaposed along the inner bottom surface 32 of the body on the front surface side of the power supply board 20. The power supply input unit 20a is exposed outside the body via a hole 20b open to the back surface 35 of the body, and receives electric power from an external commercial power supply via a power supply cord (not shown).

A control board 22 having a control circuit including a CPU for controlling the entire apparatus, an image information processing circuit, and the like is placed on the left side of the image forming unit B and along an inner left side surface 34 of the body at a position near the back surface 35 of the body. The control board 22 is placed above the power supply board 20 and high-voltage board 21. The control board 22 may be placed on the side of a right side surface 33.

An NCU board 23 having a communication circuit including an NCU, modem, and the like for communicating image information is placed behind the nearly vertical paper feed unit D of the image forming unit B and along the inner back surface 35. The board 23 is placed above the power supply board 20.

A modular board 24 having a modular jack connector 24a for connecting the apparatus to a telephone line is similarly placed along the inner back surface 35 of the body to be juxtaposed on the right side of the NCU board 23 at a position above the power supply board 20. The modular jack connector 24a is exposed outside the body via a hole 24b open to the back surface 35 of the body, and is connected to a telephone line via a modular cable (not shown), thus allowing communications of image data and the like.

The power supply board 20 and high-voltage board 21, the power supply board 20 and control board 22, the power supply board 20 and NCU board 23, the high-voltage board 21 and control board 22, the control board 22 and NCU board 23, and the NCU board 23 and modular board 24 are electrically connected to each other via cables, connectors, and the like to supply electric power, exchange signals, and connect ground.

Since the respective circuit boards are mounted on the three neighboring, orthogonal inner surfaces, i.e., the bottom surface 33, left side surface 34, and back surface 35, the routes of connection means such as cables, connectors, and the like for electrically connecting the respective boards can be simplified very much, thus allowing very easy assembly and reducing assembly cost. Also, a connection means for connecting two boards does not cross another board, and the need for an insulating member which is required due to crossing can be obviated, thus reducing the parts cost.

In this embodiment, power supply voltage differences in units of countries can be coped with by exchanging the power supply board 20. Also, network specification differences in units of countries can be coped with by exchanging the NCU board 23. In this way, the high-voltage board 21, control board 22, and modular board 24 can be commonly used even under different specifications in units of countries, thus reducing the manufacturing cost and management cost of these boards 21, 22, and 24.

Since the power supply input unit 20*a* and modular jack connector 24*a* are exposed outside the body via the holes 20*b* and 24*b*, which are open to the back surface 35 of the body, the power supply cord and modular cable can extend from the back surface 35 side. When this apparatus is used on the desktop, these cords do not require any extra spaces on the desktop, and the practical installation space can be minimized.

Also, since the paper feed unit D of the image forming unit B is nearly vertically placed to nearly vertically support recording sheets 2, and the process cartridge C is attached to/detached from the front surface direction, the NCU board 23 and modular board 24 can be placed on the back surface 35 portion of the body to extend the above-mentioned cords from the back surface 35 side. In addition, the apparatus can be rendered compact irrespective of the size of recording sheets 2 to be fed. Furthermore, since the paper feed unit D is nearly vertically set, the leading end position of the recording sheet 2 can be brought closer to the transfer means 4, and the convey time of the recording sheet 2 from the paper feed unit D to the transfer means 4 can be shortened, thus attaining high-speed image recording.

In the aforementioned arrangement, the power supply board 20 and high-voltage board 21 may be integrated. Also, the NCU board 23 and modular board 24 may be integrated. Furthermore, the image forming unit B may use other image forming schemes such as the ink-jet scheme, thermal scheme, and the like.

The above-mentioned layout of the circuit boards and the arrangement of the present invention that pertains to the layout of the image forming unit can also be applied to other image reading/recording apparatuses such as copying machines, and the like.

As can be seen from the above description, according to the present invention, in the image reading/recording apparatus, since the route of connection means such as cables, connectors, and the like for electrically connecting circuit boards can be simplified very much by the efficient layout of the circuit boards, easy assembly can be assured, and the assembly cost can be reduced. Since the connection means for connecting two boards can be prevented from crossing another board, and the need for an insulating member which is required conventionally due to crossing can be obviated, the parts cost can also be reduced. Since the circuit boards are classified into those to be exchanged in correspondence with differences in units of countries, and those which can be commonly used, the manufacturing cost and management cost of the common circuit boards can be reduced. Hence, a low-cost apparatus can be realized.

Since the cords such as a power supply cord, modular cable, and the like can extend from the back surface side of the body, when the apparatus is used on the desktop, these cords do not require any extra space on the desktop, and the practical installation space can be minimized. Hence, an apparatus convenient for the user can be provided.

Furthermore, since a medium supply unit for supplying a recording medium to an image forming unit vertically supports recording media, the apparatus can be rendered compact irrespective of the size of recording media. Moreover, since the leading end position of the recording medium on the medium supply unit is brought closer to the image recording means of the image forming unit to shorten the convey time of the recording medium from the medium supply unit to the image recording unit, high-speed image recording can be realized.

What is claimed is:

1. An image reading/recording apparatus having an image reading unit for reading image information, and an image forming unit for recording an image on a recording medium, the apparatus comprising:

a first circuit board placed along an inner bottom surface of an apparatus body at a position near a back surface of the apparatus body;

a second circuit board placed along one inner side surface of the apparatus body;

a third circuit board placed along an inner back surface of the apparatus body; and a fourth circuit board placed along the inner bottom surface of the apparatus body to be juxtaposed with said first circuit board on a front surface side of the apparatus body, said fourth circuit board having a high-voltage circuit for supplying a high voltage;

first connection means for electrically connecting said fourth and first circuit boards; and second connection means for electrically connecting said fourth and second circuit boards.

2. An apparatus according to claim 1, further comprising:
connection means for electrically connecting said first and second circuit boards.

3. An apparatus according to claim 1, further comprising:
connection means for electrically connecting said first and third circuit boards.

4. An apparatus according to claim 1, further comprising:
connection means for electrically connecting said second and third circuit boards.

5. An apparatus according to claim 1, wherein said first circuit board has a power supply input unit.

6. An apparatus according to claim 1, wherein said second circuit board has a control circuit for controlling the entire apparatus.

7. An apparatus according to claim 1, wherein said second circuit board has an image information processing circuit.

8. An apparatus according to claim 1, wherein said third circuit board has a communication circuit for communicating image information.

9. An apparatus according to claim 1, further comprising:

a fifth circuit board placed along the inner back surface of the apparatus body to be juxtaposed with said third circuit board, said fifth circuit board having a line connection unit for connecting said apparatus to a communication line; and third connection means for electrically connecting said fifth and third circuit boards.

10. An apparatus according to claim 1, further comprising:

a medium supply unit for vertically supporting recording media to be supplied to said image forming unit;

a medium exhaust unit for supporting the exhausted recording medium after an image is recorded by said image forming unit; and a recording medium conveying path for conveying a recording medium from said medium supply unit to said medium exhaust unit though said image forming unit.

11. An apparatus according to claim 10, wherein said image forming unit comprises a photosensitive body placed above said recording medium convey path, light irradiation means, placed above said photosensitive body, for irradiating said photosensitive body with light corresponding to image information and forming an electrostatic latent image, toner image forming means, placed above said recording medium convey path, for applying toner to said photosensitive body to form a toner image corresponding to the electrostatic latent image, transfer means, placed below said recording medium convey path, for transferring the toner image formed on said photosensitive body to the recording medium, and fixing means for fixing the toner image, which has been transferred onto the recording medium by said transfer means, on the recording medium.

12. An image reading/recording apparatus comprising:
   an apparatus body;
   an original convey path for conveying an original from above said apparatus body to a front portion thereof;
   a recording medium convey path for conveying a recording medium from above said apparatus body to the front portion thereof;
   an image reading unit for reading image information by conveying the original along said original convey path;
   an image forming unit for recording an image on the recording medium by conveying the recording medium along said recording medium convey path;
   a first circuit board placed along an inner bottom surface of said apparatus body at a position near a back surface of said apparatus body;
   a second circuit board placed along one inner side surface of said apparatus body;
   a third circuit board placed along an inner back surface of said apparatus body;
   a fourth circuit board placed along the inner bottom surface of the apparatus body to be juxtaposed with said first circuit board on a front surface side of the apparatus body, said fourth circuit board having a high-voltage circuit for supplying a high voltage;
   first connection means for electrically connecting said fourth and first circuit boards; and
   second connection means for electrically connecting said fourth and second circuit boards.

13. An image reading/recording apparatus having an image reading unit for reading image information, and an image forming unit for forming an image and recording the image on a recording medium, comprising:
   an apparatus body;
   a power supply board placed along an inner bottom surface of an apparatus body at a position near a back surface of the apparatus body;
   a control board placed along one inner side surface of the apparatus body and having a control circuit for controlling the entire apparatus and an image information processing circuit; and
   an NCU board placed along an inner back surface of the apparatus body and having a communication circuit for communicating image information; and
   connection means for electrically connecting said power supply board and control board, said power supply board and NCU board, and said control board and NCU board.

14. An image recording apparatus having an image forming means for forming an image on a recording medium, said apparatus comprising:
   a first circuit board placed along an inner bottom surface of an apparatus body at a position close to a back surface of the apparatus body;
   a second circuit board placed along one inner side surface of the apparatus body;
   a third circuit board placed along an inner back surface of the apparatus body;
   a fourth circuit board placed along the inner bottom surface of the apparatus body to be juxtaposed with said first circuit board at a position close to a front surface of the apparatus body, said fourth circuit board having a high-voltage circuit for supplying a high voltage;
   a first connection means for electrically connecting said fourth and first circuit boards; and
   a second connection means for electrically connecting said fourth and second circuit boards.

15. An image recording apparatus having an image forming means for forming an image on a recording medium, said apparatus comprising:
   a first circuit board placed along an inner bottom surface of an apparatus body at a position close to a back surface of the apparatus body;
   a second circuit board placed along one inner side surface of the apparatus body;
   a third circuit board placed along an inner back surface of the apparatus body;
   a first connection means for electrically connecting said first and second circuit boards;
   a second connection means for electrically connecting said second and third circuit boards; and
   a third connection means for electrically connecting said third and first circuit boards.

* * * * *

UNITED STATES PATENT AND TRADEMARK OFFICE
CERTIFICATE OF CORRECTION

PATENT NO. : 6,342,955 B1
DATED : January 29, 2002
INVENTOR(S) : Yasuhiro Matsumoto It is certified that error appears in the above-identified patent and that said Letters Patent is hereby corrected as shown below:

Column 5,
Line 50, "center 16" should read -- center 17 --.

Column 6,
Line 12, "the an" should read -- an --.

Column 9,
Line 1, "convey" should read -- conveying --;
Line 6, "convey" should read -- conveying --; and
Line 9, "convey" should read -- conveying --.

Signed and Sealed this

Seventeenth Day of December, 2002

JAMES E. ROGAN
*Director of the United States Patent and Trademark Office*